(12) United States Patent  (10) Patent No.: US 8,779,572 B2
Lin et al.                 (45) Date of Patent:     Jul. 15, 2014

(54) ON-CHIP HEAT SPREADER

(71) Applicant: Taiwan Semiconductor Manufacturing Company, Ltd., Hsin-Chu (TW)

(72) Inventors: Chuan-Yi Lin, Hsin-Chu (TW); Ching-Chen Hao, Zhubei (TW); Chen Cheng Chou, Shanhua Township (TW); Sheng-Yuan Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/071,937

(22) Filed: Nov. 5, 2013

(65) Prior Publication Data

US 2014/0054761 A1    Feb. 27, 2014

Related U.S. Application Data

(63) Continuation of application No. 13/681,152, filed on Nov. 19, 2012, now Pat. No. 8,609,506, which is a continuation of application No. 12/617,500, filed on Nov. 12, 2009, now Pat. No. 8,314,483.

(60) Provisional application No. 61/147,368, filed on Jan. 26, 2009.

(51) Int. Cl.
 *H01L 29/861* (2006.01)

(52) U.S. Cl.
 USPC .............. 257/686; 257/675; 257/E23.101; 257/706; 257/784; 257/635; 257/777; 438/418; 438/127; 438/102; 438/106; 438/73; 438/122; 438/612; 438/667; 438/672; 438/675

(58) Field of Classification Search
 USPC .......... 257/686, E23.101, 675, 635, 637, 706, 257/707, 784, 774, 777; 438/418, 127, 124, 438/102, 106, 73, 122, 612, 667, 672, 675
 See application file for complete search history.

(56) References Cited

U.S. PATENT DOCUMENTS

| 5,391,917 | A  | 2/1995  | Gilmour et al. |
| 5,510,298 | A  | 4/1996  | Redwine |
| 5,767,001 | A  | 6/1998  | Bertagnolli et al. |
| 5,998,292 | A  | 12/1999 | Black et al. |
| 6,184,060 | B1 | 2/2001  | Siniaguine |
| 6,322,903 | B1 | 11/2001 | Siniaguine et al. |
| 6,448,168 | B1 | 9/2002  | Rao et al. |

(Continued)

OTHER PUBLICATIONS

Beyne, E. et al. "3D System Integration Technologies," 2007, IEEE, pp. 1-3.

(Continued)

*Primary Examiner* — S. V. Clark
*Assistant Examiner* — Krista Soderholm
(74) *Attorney, Agent, or Firm* — Slater and Matsil, L.L.P.

(57) ABSTRACT

A three dimensional (3D) stacked chip structure with chips having on-chip heat spreader and method of forming are described. A 3D stacked chip structure comprises a first die having a first substrate with a dielectric layer formed on a front surface. One or more bonding pads and a heat spreader may be simultaneously formed in the dielectric layer. The first die is bonded with corresponding bond pads on a surface of a second die to form a stacked chip structure. Heat generated in the stacked chip structure may be diffused to the edges of the stacked chip structure through the heat spreader.

20 Claims, 11 Drawing Sheets

(56) References Cited

U.S. PATENT DOCUMENTS

| | | |
|---|---|---|
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Sinaguine et al. |
| 6,740,582 B2 | 5/2004 | Sinaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,572,680 B2 | 8/2009 | Hess et al. |
| 7,956,343 B2 | 6/2011 | Kwon et al. |
| 7,964,959 B2 | 6/2011 | Jung |
| 8,314,483 B2 | 11/2012 | Lin et al. |
| 2008/0185565 A1 | 8/2008 | Major et al. |
| 2008/0185568 A1 | 8/2008 | Kwon et al. |
| 2010/0032794 A1 | 2/2010 | Pendharkar et al. |
| 2010/0148353 A1 | 6/2010 | Kim et al. |
| 2011/0042579 A1 | 2/2011 | De Boer et al. |
| 2013/0078765 A1 | 3/2013 | Lin et al. |

OTHER PUBLICATIONS

Kuo, T. et al., "Reliability Tests for a Three Dimensional Chip Stacking Stucture with Through Silicon Via Connections and Low Cost," 2008 Electronic Components and Technology Conference, pp. 853-258.

Pieters, P. et al., "3D Wafer Level Packaging Approach Toward Cost Effective Low Loss High Density 3D Stacking," 2006 7th International Conference on Electronics Packaging Technology, 4 pages.

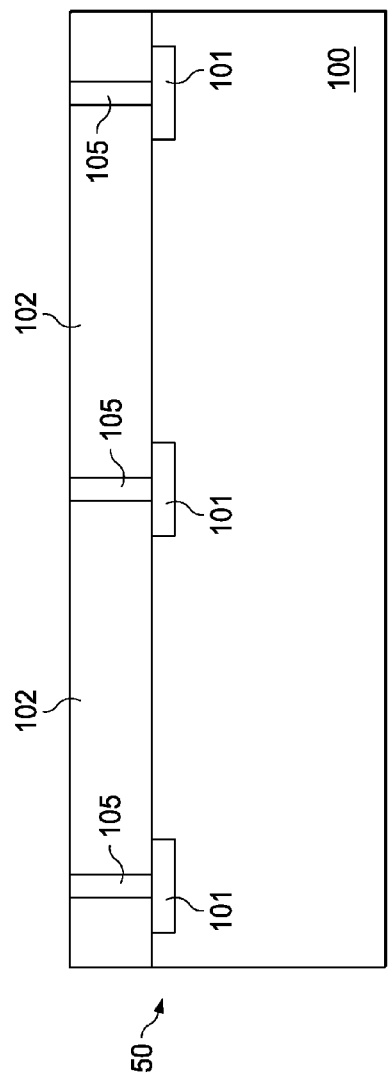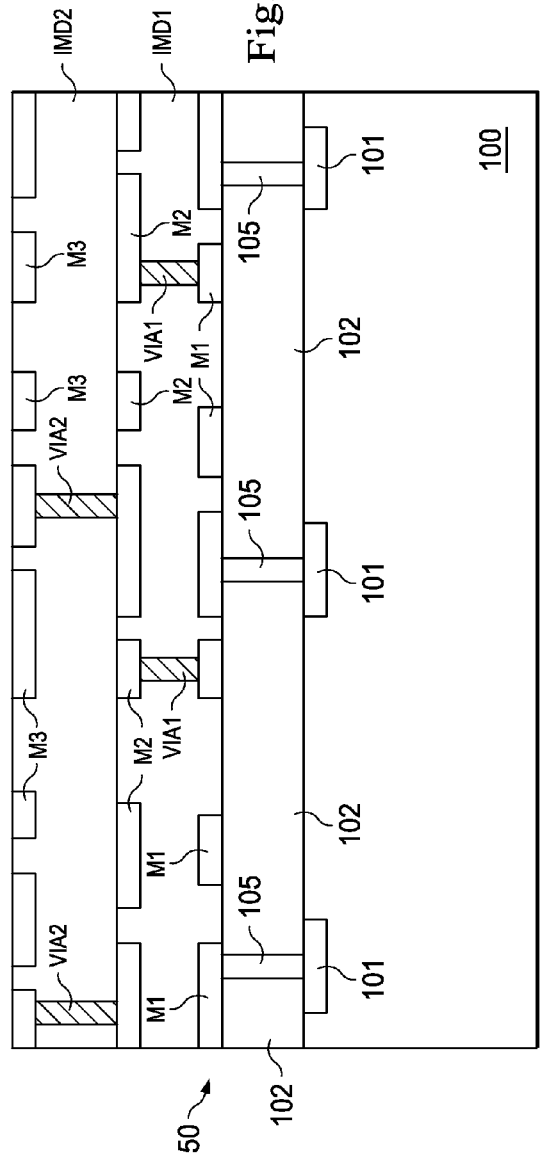
Fig. 1a
Fig. 1b

ON-CHIP HEAT SPREADER

RELATED APPLICATIONS

This application is a continuation of U.S. patent application Ser. No. 13/681,152, filed on Nov. 19, 2012, and entitled "On-Chip Heat Spreader," which application is a continuation of U.S. Pat. No. 8,314,483, filed on Nov. 12, 2009, and entitled "On-Chip Heat Spreader," which application further claims the benefit of U.S. Provisional Patent Application No. 61/147,368 entitled "On-Chip Heat Spreader," filed Jan. 26, 2009, which application is incorporated herein by reference.

TECHNICAL FIELD

The present invention relates generally to integrated circuit fabrication and, more particularly, to an on-chip heat spreader and method of forming a three dimensional (3D) stacked chip structure with chips having an on-chip heat spreader.

BACKGROUND

While integrated circuit technology evolves, 3D stacked chip technology is gaining increasing popularity to provide improved performance for many applications. In contrast to a system-on-a-chip (SOC) approach where functional blocks are formed on a single monolithic substrate, a 3D stacked chip structure may be formed consisting of a stack of dies with heterogeneous devices. As an example, a 3D stacked chip structure may comprise a RF circuit die, a die with a signal processing unit, a die with sensor function, and a die with a power management unit. These dies are bonded together in a stacking manner, thus realizing a system-in-a-package configuration with each functional unit optimized for desired performance and circuit density. These dies are typically joined together through bonding pads formed in their respective external passivation layers. The bonded result produces a 3D stacked chip structure having multiple dies of integrated circuitry.

Additionally, forming a 3D stacked chip structure has been shown to significantly reduce the communication path length between components on different integrated circuit dies, provided the vertical distances between the layers are much smaller than the individual die size. Thus, through stacking dies vertically, the overall system speed is typically increased. Such a system configuration may also save package size and consumes less power.

In order to enable the various circuits and devices in a 3D stacked chip structure, vertical electrical connections are generally formed to connect the various components integrated within the various stacked dies. Such electrical connections are typically realized by through-silicon vias (TSVs) that are fabricated passing completely through a die, thereby providing electrical connections between the devices formed in the different dies of the bonded chip stacking structure.

It is realized, however, that the 3D stacked chip structure may generate a significant amount of heat while such a system is in operation. As a result, the issue of heat dissipation in a 3D stacked chip structure should be raised and addressed, and solutions be sought in order to maintain the reliability and the desired performance of a stacked chip structure where high power consumption leads to a high operating temperature.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1a-1b illustrate cross-sectional views of a wafer after intermediate processing steps according to an illustrative embodiment;

DETAILED DESCRIPTION OF ILLUSTRATIVE EMBODIMENTS

Figure 2A:
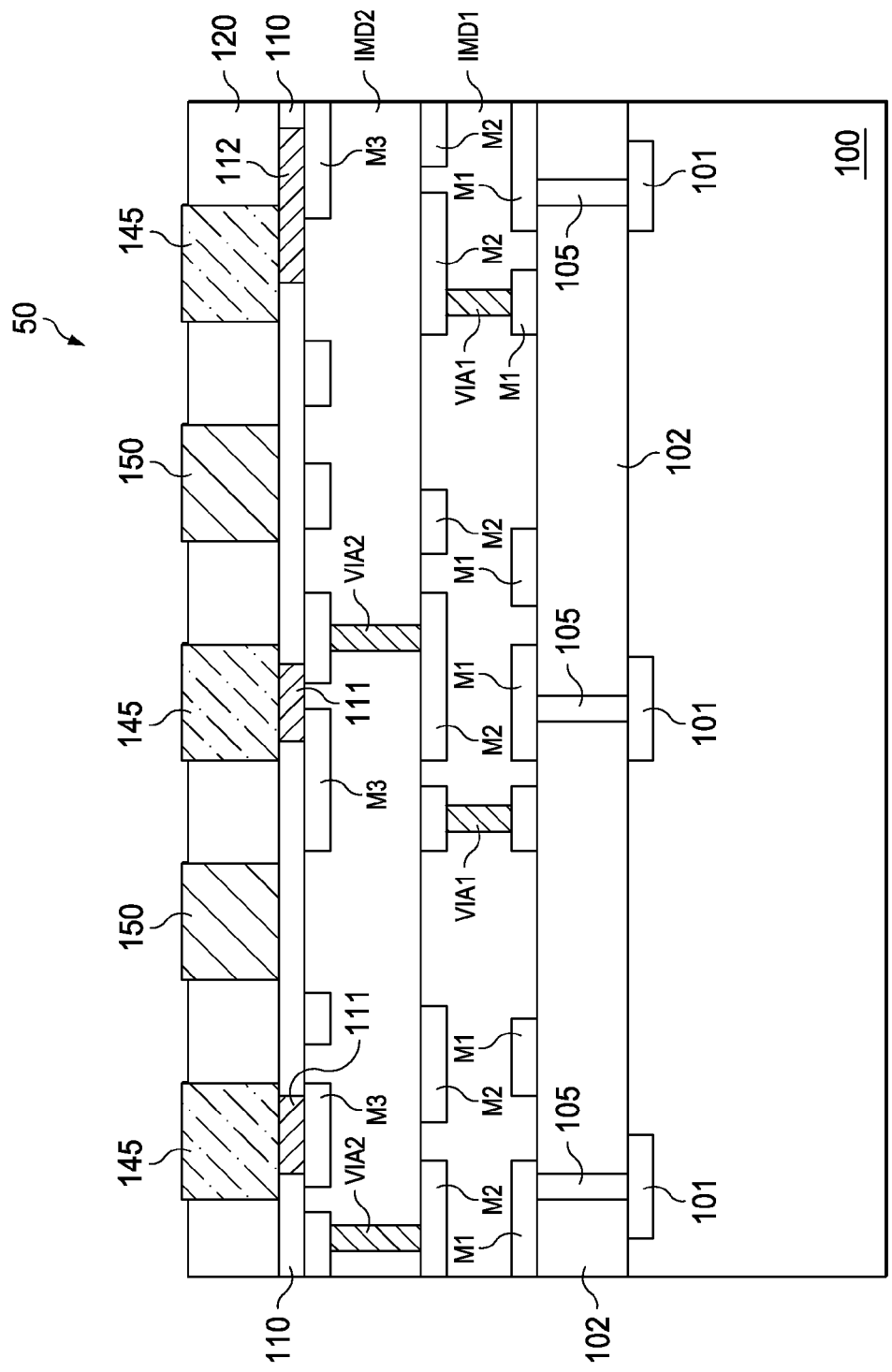
FIGS. 2a-2d illustrate cross-sectional views of a wafer having an on-chip heat spreader according to an illustrative embodiment.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

With reference now to FIG. 1a, there is shown a cross-sectional diagram of the wafer 50. The wafer 50 comprises the semiconductor substrate 100, which is typically silicon (Si), but may also be made of silicon germanium (SiGe), gallium arsenide (GaAs), gallium arsenide-phosphide (GaAsP), indium phosphide (InP), gallium aluminum arsenic (GaAlAs), indium gallium phosphide (InGaP), and the like, and illustrates devices 101 formed in the substrate 100. While only three devices 101 are shown, there may be many active and/or passive semiconductor devices 101 formed in the substrate 100.

The insulating layer 102 is deposited on the substrate 100 of the wafer 50. The insulating layer 102 is also sometimes referred to as an inter-layer dielectric (ILD) layer. In an embodiment, materials used to form the ILD layer 102 include silicon dioxide ($SiO_2$) and phosphosilicate glass (PSG). In another embodiment, the ILD layer 102 comprises a low dielectric constant (low-k) material, such as carbon-doped silicon oxide layer or fluorine-doped silicate glass (FSG), although other low-k dielectric materials may be also used for the ILD layer 102. A photolithography process may be used to pattern the ILD layer 102, defining the electrical connections (contacts) 105 to the devices 101 previously formed in the semiconductor substrate 100. An etch process, such as an anisotropic dry etch process, can be performed after the photolithography to form contact openings in the ILD layer 102. Afterward, the electrical contacts 105 to the devices 101 may be formed by filling the contact openings with conductive materials by a metallization process, such as a metallic chemical vapor deposition (CVD) process. Conductive materials that may be used to form the contacts 105 include aluminum (AL), copper (Cu), tungsten (W), cobalt (Co), other metal or metal alloy, although other suitable conductive materials or processes may be also used to form the contacts 105. A planarization process, such as a chemical mechanical polishing (CMP), may be then performed on the substrate surface to remove the excess contact materials, providing a substantially flat substrate surface preferable for the subsequent processing steps. In preferred embodiments, a barrier layer (not shown), such as a titanium nitride (TiN) layer, may be formed by a suitable process within the contact openings prior to the formation of the contact 105. A barrier layer may prevent any metals deposited in the metallization process from leaching into the substrate 100 or surrounding ILD layer.

Illustrated in FIG. 1b, conductive features M1 are formed in a first interconnect layer atop the planarized substrate from previous processing steps. Through a damascene, dual-damascene, or like process known in the art, the conductive features M2 are formed in a second interconnect layer embedded in a first inter-metal dielectric layer IMD1, and may be coupled to underlying M1 features through vias (e.g., via1) formed in the first inter-metal dielectric layer IMD1. Similarly, conductive features M3 are formed in a third interconnect layer embedded in a second inter-metal dielectric layer IMD2, and may be coupled to underlying M2 features through vias (e.g., via2) formed in the second inter-metal dielectric layer IMD2. Various conducting materials, such as copper, tungsten, aluminum, gold, silver, and the like, may be used to form conductive features M1, M2 and M3. In the current embodiment, the IMD layers are preferably a low-k material, such as carbon-doped silicon oxide layer or FSG, although other suitable dielectric materials may also be used. Also, copper is preferably used to form the metal features in the various interconnect layers and the vias, although other suitable conductive materials, such as Al, Cu, W, Co, or other metallic materials may also be used.

In another embodiment, conductive features M1, M2 and M3 are formed through a process flow comprising a metallic CVD process to form an interconnect metal layer, a photolithography process to transfer a pre-determined pattern in the interconnect metal layer, and an etch process to form the patterned features in the interconnect metal layer.

Metal features and vias formed through the above processes are used to provide electrical connections among the various semiconductor devices 101 formed in substrate 100 or electrical connections between the devices 101 and components in other semiconductor integrated circuit dies coupled to the wafer 50.

It is noted that, although only three interconnect metal layers are shown in FIG. 1b, similar processing flows/steps described above may be repeated to form metal features and vias in the upper interconnect metal layers and inter-metal dielectric layers until the uppermost interconnect metal layer.

FIGS. 2a-2d are collectively used to illustrate forming one or more heat spreaders on an IC die, such as that discussed above with reference to FIGS. 1a and 1b, which may be bonded with other similar IC dies to form a 3D stacked chip structure according to a preferred embodiment of the present invention. FIG. 2a illustrates that an insulating layer 110 is formed on the wafer 50 from previous processing steps (e.g., FIG. 1b). Insulating layer 110 insulates devices and interconnect metal features in the wafer 50 from any other circuitry or devices in any wafers/dies bonded to the wafer 50. The insulating layer 110 may also prevent any harmful materials from leaching into any active portions of the circuitry of the wafer 50. In an embodiment, PSG, undoped silicate glass (USG) or silicon nitride is deposited through a plasma enhanced CVD (PECVD) to form the insulating layer 110, although other suitable materials and processes may be also used. Conductive interfaces, such as the contacts 111 or the redistribution feature 112, are formed in the insulating layer 110, providing electrical connection between conductive features in active portions of the circuitry of the wafer 50 and bonding pads on a bonding surface of the wafer 50.

An additional dielectric layer 120 is formed on insulating layer 110. Materials and processing techniques used to form the insulating layer 110 may be used to form the dielectric layer 120, although other suitable materials and processes may be also used. The bonding pads 145 are formed in the dielectric layer 120 and are electrically coupled to the metal features preferably in the uppermost interconnect metal layer of the wafer 50 (e.g., metal features M3) through a conductive interface 111 or 112 embedded in the insulating layer 110, for example. Conductive materials used to form the bonding pads 145 may comprise aluminum (Al), copper (Cu), tungsten (W), cobalt (Co), gold (Au), silver (Ag), a copper-tin alloy, a gold-tin alloy, an indium-gold alloy, a lead-tin alloy, or the like, although other suitable conductive materials may be also used. It is also noted that the interface may comprise a direct connection, such as the contacts 111, but may also comprise an indirect connection through a redistribution feature 112 in the insulating layer 110. The various embodiments of the present invention are not limited to only direct connections between bonding pads and interconnect features in the upper interconnect layers.

Figure 2B:
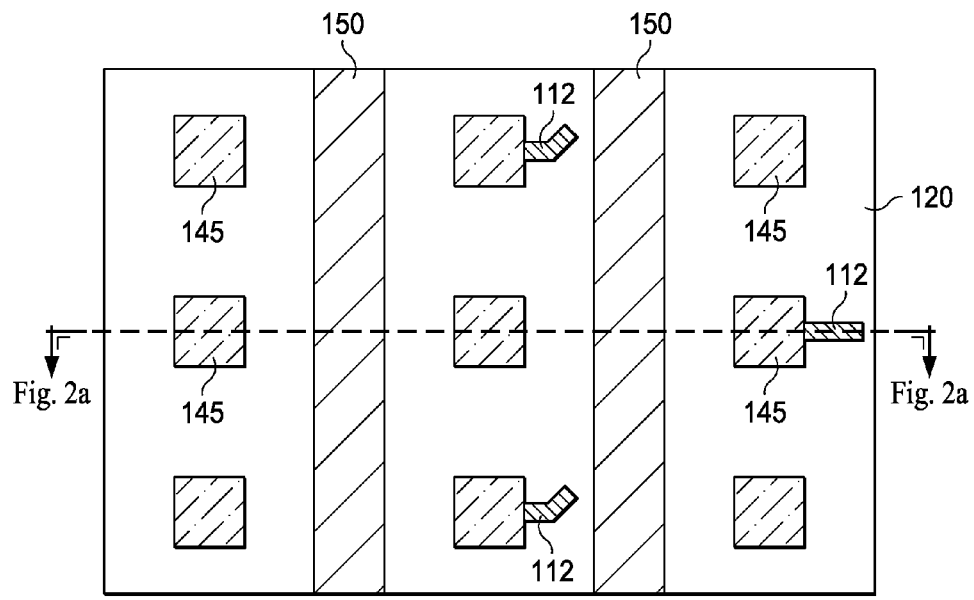
Figure 2C:
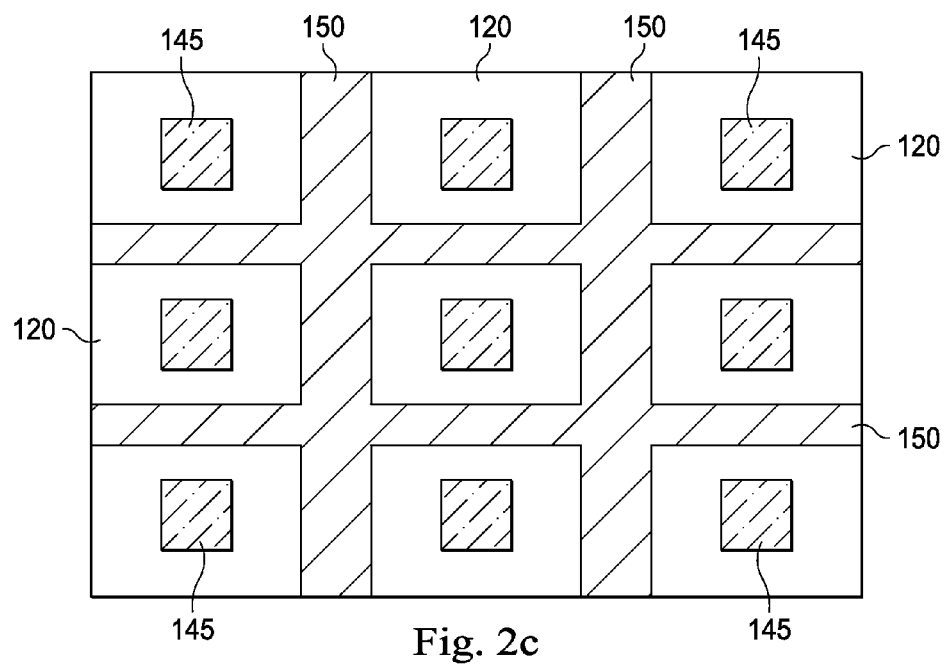
Figure 2D:
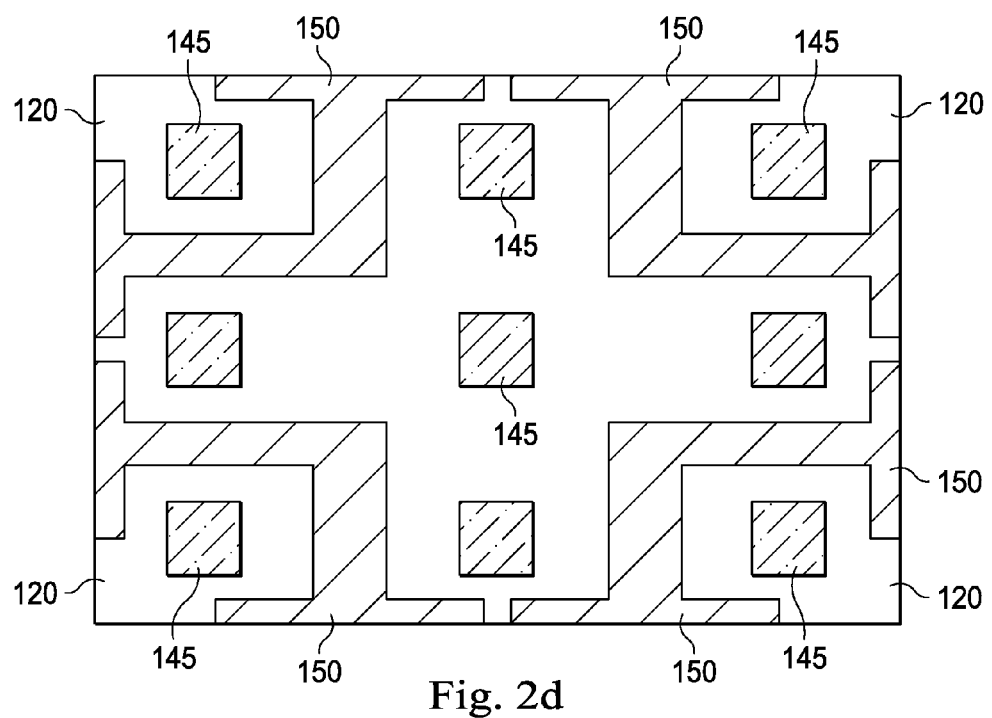

FIG. 2a also shows the heat spreaders 150 formed in the dielectric layer 120. The heat spreaders 150 comprise metal features that are electrically insulated from the bonding pads 145 and the interconnect metal features, such as M3, and the contacts 111 and the redistribution feature 112. Each heat spreader 150 preferably has large surface area and extends in the dielectric layer 120 from a center location to the edges of the wafer 50 so that heat generated in the wafer 50 during operation can be conducted from local high temperature spots on the wafer 50 surface to the edges of the wafer 50. Even more preferably, each spreader comprises an elongate feature having at least one major axis extending from a center region of the wafer 50 to an outer edge of the wafer 50, as is illustrated in FIG. 2b. In an embodiment, materials used to form the heat spreader may comprise aluminum (Al), copper (Cu), tungsten (W), cobalt (Co), gold (Au), silver (Ag), a copper-tin alloy, a gold-tin alloy, an indium-gold alloy, a lead-tin alloy, or the like. Also, processing techniques, such as metallic CVD and metal plating are adopted to form the thermal-conducting features of the heat spreader 150. In an embodiment, the bonding pads 145 and the heat spreader 150 are formed simultaneously through common processing steps. In another embodiment, the heat spreader 150 may be formed in separate process steps by materials with optimized thermal-conductivity.

FIG. 2b is a top view of the wafer 50 illustrating a configuration of the heat spreaders 150 in accordance with an embodiment of the present invention. It should be noted that the embodiment illustrated in FIG. 2b illustrates a stripe pattern for illustrative purposes only. Other embodiments may use any suitable patterns, such as those shown in FIGS. 2c and 2d, in an effort to diffuse heat to the wafer edges efficiently. The specific pattern or lack of pattern of the heat spreaders 150 that may be illustrated herein are not intended to limit the embodiments of the present invention in any way. Additionally, special design rules, such as "slotting" rule, may apply to the layout of the heat spreaders 150 to address the reliability issues associated with the thermal stresses built in the heat spreaders 150, for example.

Figure 3A:
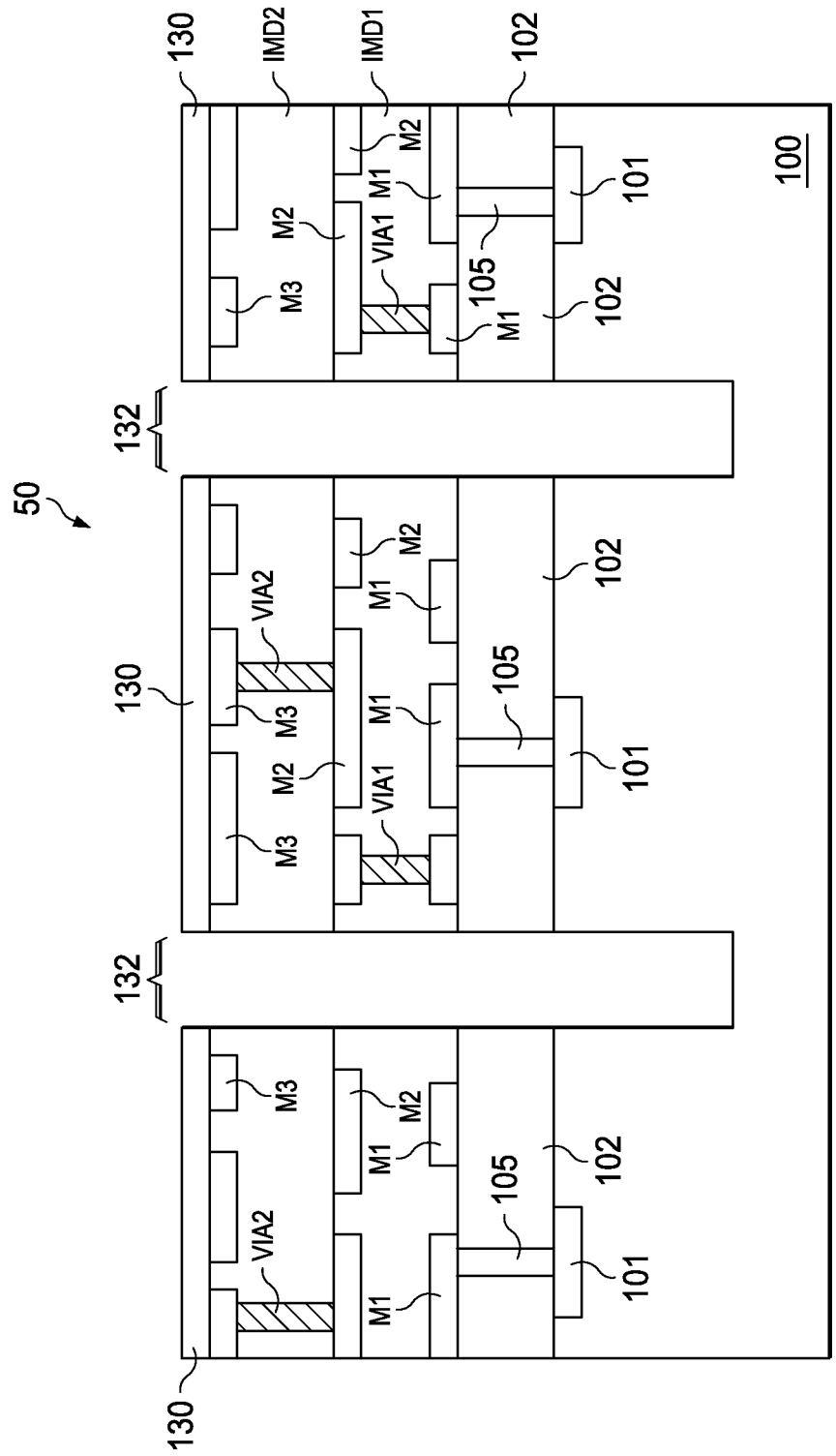
FIGS. 3a-3d illustrate cross-sectional views of a wafer having through-silicon-vias (TSVs) and an on-chip heat spreader according to an illustrative embodiment.

FIGS. 3a-3d are collectively used to illustrate forming an IC die with heat spreader according to another preferred embodiment of the present invention. FIG. 3a illustrates that a mask layer 130 is formed atop the wafer 50 surface from previous processing steps (e.g., FIG. 1b). The mask layer 130 is patterned and etched using photolithography and etch processes known in the art to form openings that expose the wafer surface regions 132 where through-silicon vias (TSVs) are to be formed in the substrate 100 in subsequent processing steps. Therefore, the wafer surface regions 132 are also generally referred to as the TSV regions 132. The patterned mask layer 130 is preferably a hard mask layer comprising a dielectric material, such as silicon nitride (SiNx) or silicon dioxide (SiO$_2$), in a single or multiple-layer configuration, although other suitable organic or inorganic hard mask materials may be also used. Alternatively, a patterned photoresist may be also used to form the patterned mask layer 130. In an embodiment where silicon nitride is used for the patterned mask layer 130, it preferably has a thickness of about 50 µm to about 500 µm.

In FIG. 3a, the wafer 50 is processed with a first etch process to remove inter-metal layers IMD2 and IMD1 under the TSV regions 132. In an embodiment, in which the ILD layer 102 comprises silicon dioxide, a second etch process is performed to remove the ILD layer 102 under the TSV regions 132. Afterwards, the wafer 50 is processed with a third etch process in the recesses created from the previous etch steps to remove the substrate 100 material, e.g., silicon, and extend the recesses into the substrate 100. In one preferred embodiment, the third etch process is a time-controlled anisotropic plasma etch process that creates TSV recesses having a depth of about 2 microns to about 75 microns in substrate 100. In another embodiment, the ILD layer 102 comprises low-k dielectric materials similar to those used for the IMD1 and IMD2 layers, thus the removal of the IMD layers and the ILD layer 102 under the TSV regions 132 may be performed through a single anisotropic etch process, which has a high etch selectivity rate of low-k material to the silicon substrate 100. After the formation of the TSV recesses in the wafer 50, the patterned mask layer 130 may be subsequently removed by known processing techniques.

It should be noted that TSV recesses are herein shown to be formed after the formation of the devices 101 and metal features in the interconnect metal layers for illustrative purposes only. Those skilled in the art will realize that a TSV recess may also be formed at various points of a typical back-end-of-line (BEOL) process flow of fabricating an IC. As an example, a TSV recess may be formed in substrate 100 before the formation of devices 101 and interconnect metal features. As another example, a TSV recess may be formed after the formation of the devices 101, but before the formation of the interconnect metal features. As an additional example, a TSV recess may be formed after the completion of a certain interconnect metal layer. The specific processing steps or lack of processing steps of forming TSV recesses that may be illustrated herein are not intended to limit the embodiments of the present invention in any way.

Figure 3B:
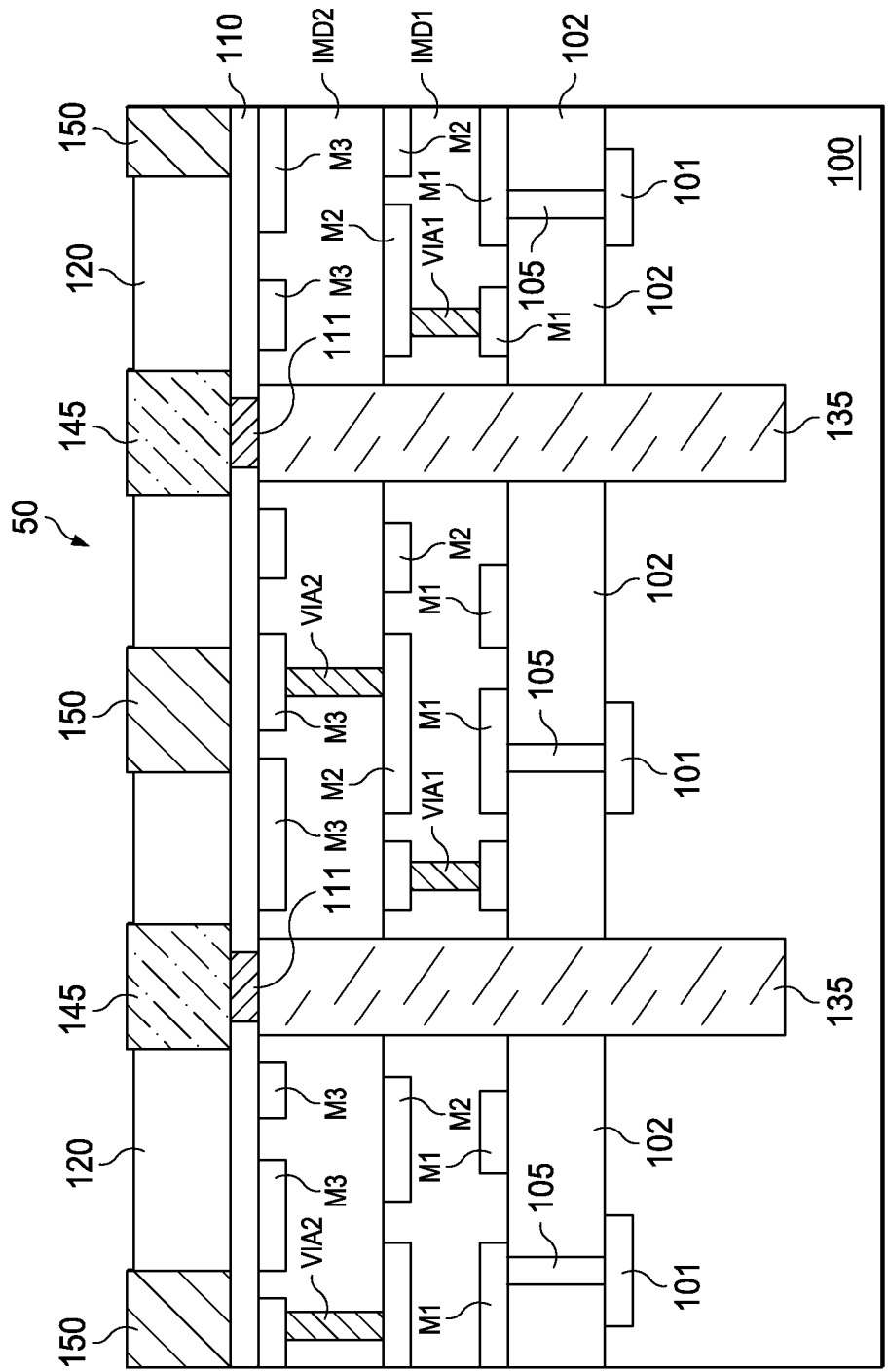

Illustrated in FIG. 3b, a metallization process, such as Cu plating, may be subsequently performed on the wafer 50, filling copper (Cu) or other suitable conductive materials in the TSV recesses to form the TSVs 135 in the wafer 50. Other suitable conductive materials, such as aluminum (Al), tungsten (W), cobalt (Co), gold (Au), silver (Ag), and other suitable deposition processes, such as a metallic CVD process, may be also used to form the TSVs 135. A CMP process may be performed afterwards on the substrate to remove excess TSV materials and provide the desired flat substrate surface for the subsequent processing steps. Optionally, a barrier layer, such as a titanium nitride (TiN) layer and/or a metal seed layer (not shown), may be formed conformally in the TSV recesses by suitable processes, such as CVD or physical vapor deposition (PVD), prior to the metallization process of forming the TSVs 135. A barrier layer in TSV recesses may prevent any conducting TSV material from leaching into any active portions of the circuitry of the wafer 50.

After the formation of the TSVs 135 in the wafer 50, materials and processing techniques described previously may be used to form the insulating layer 110, the dielectric layer 120, and the bonding pads 145 and the heat spreader 150 in the dielectric layer 120. The TSVs 135 in the wafer 50 may be electrically coupled to the bonding pads 145 through the contacts 111 or through the redistribution features 112, which are described previously with respect to FIG. 3a.

Figure 3C:
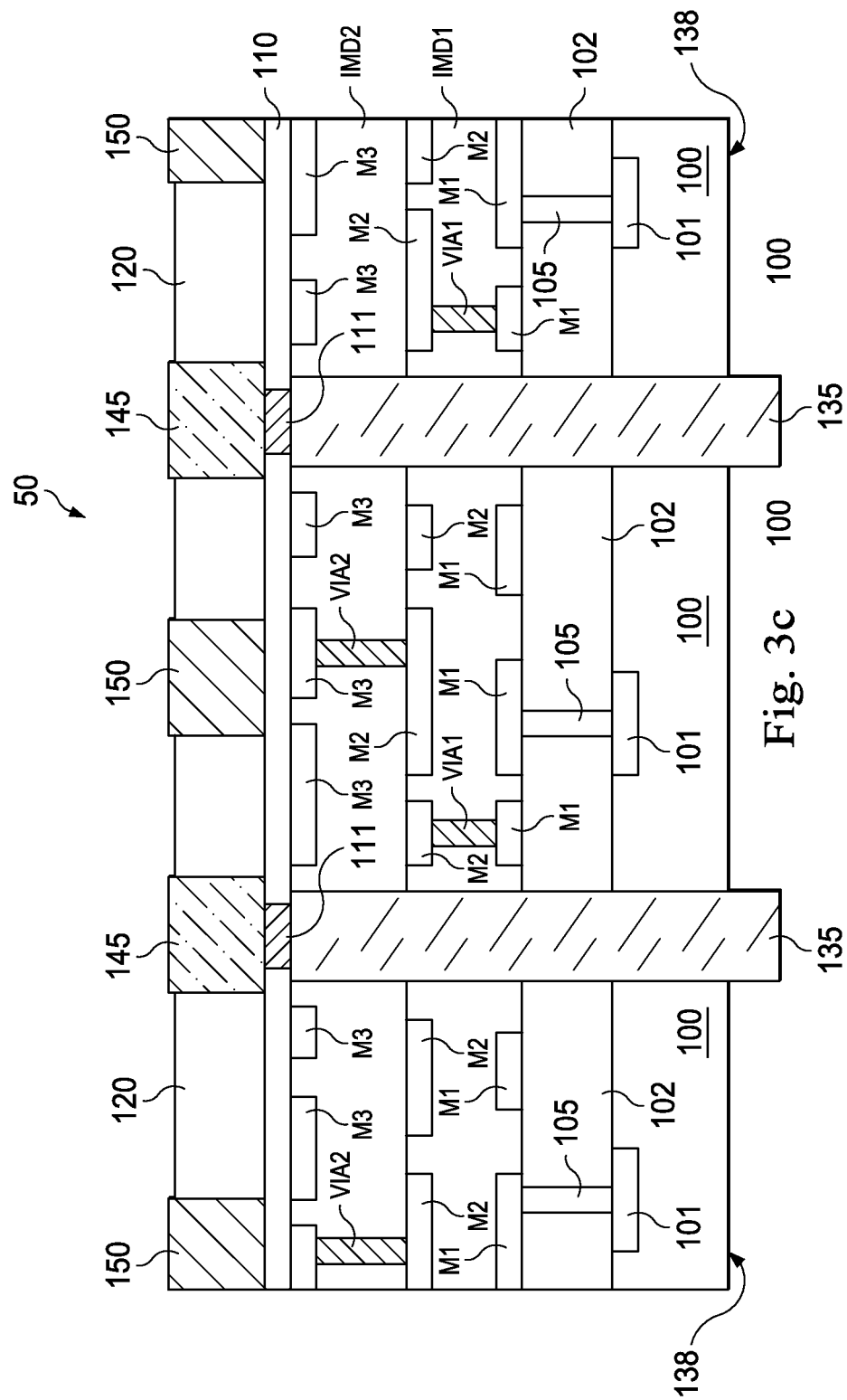

FIG. 3c illustrates that the substrate 100 is thinned from a back-side 138 through known techniques, such as back grinding, etching, CMP, or the like, and portions of the substrate 100 are removed to reveal contact points with the TSVs 135. The elevated portion of the TSVs 135 over the back-side 138 of the substrate 100 may facilitate bonding the wafer 50 to another integrated circuit wafer or die. The wafer 50 processed through the above processing steps may be bonded to other integrated circuit wafers and dies from both sides to form a 3D stacked chip structure in the current invention.

In an embodiment, a TSV 135 thus formed may be electrically coupled to the devices 101 through metal traces in the various interconnect metal layers. In another embodiment, a TSV 135 thus formed may be used as a "feed-through," coupling devices in a wafer bonded to one side of the wafer 50 to devices in a wafer bonded to the other side of the wafer structure 50.

Figure 3D:
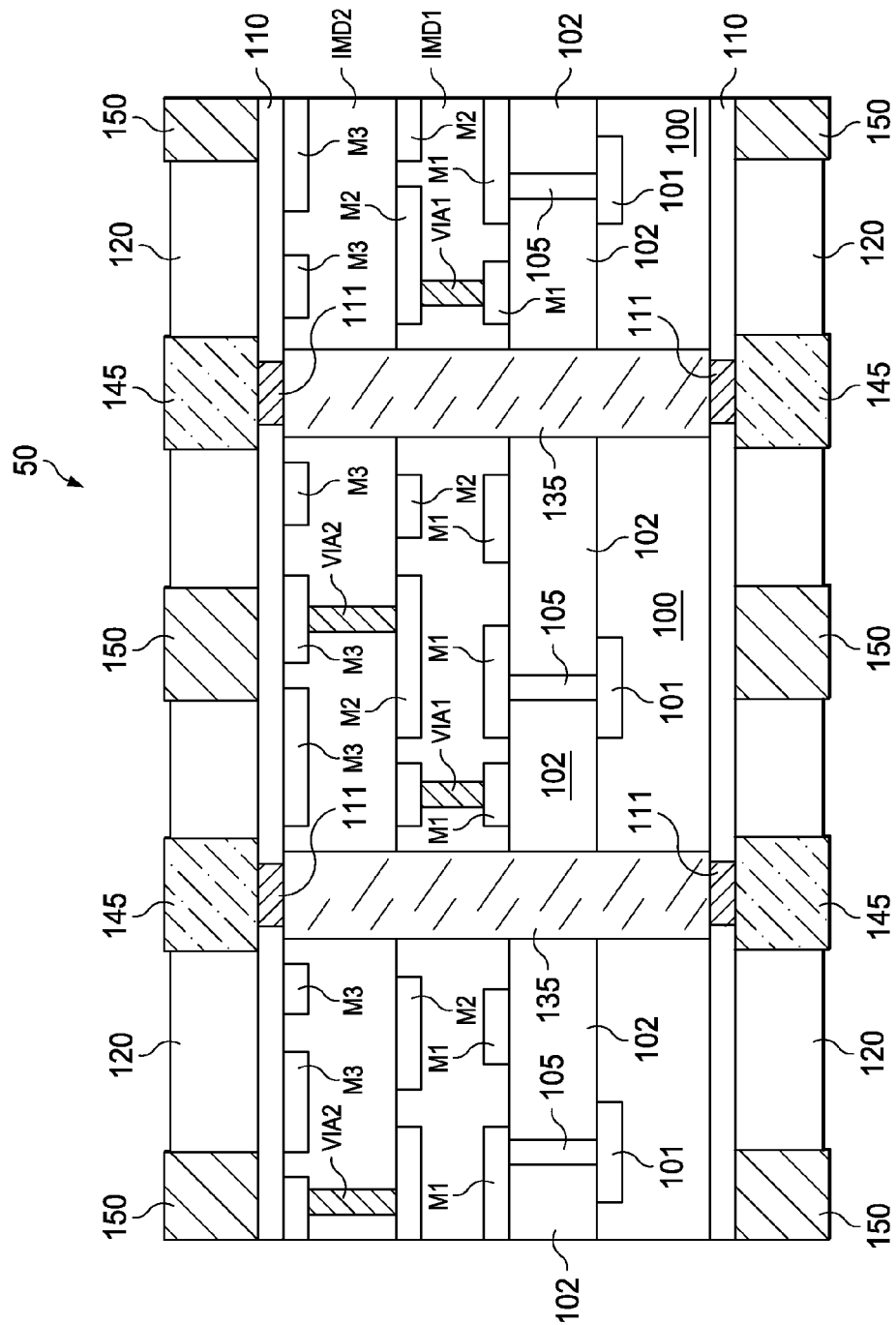

FIG. 3d illustrates that the wafer 50 from FIG. 3c may be further processed to form the insulating layer 110, the dielectric layer 120, the contacts 111, the bonding pads 145, and the heat spreader 150 over the back-side 138 (FIG. 3b) of the substrate 100 with similar materials and processing techniques used for the similar features formed previously over the front side of the wafer 50. The wafer 50 thus processed represents an additional preferred wafer configuration used to form a 3D stacked chip structure in the current invention. The wafer 50 thus formed may be bonded to other integrated circuit wafers and dies from both sides. More advantageously, the wafer 50 thus formed has heat spreaders formed over both sides of the wafer, which may lead to improved heat dissipation when a 3D stacked chip structure in preferred embodiments is under high power-consumption operation.

It should also be noted that any number of different devices, components, connectors, and the like may be integrated into the wafer 50 in the various embodiments. The specific devices or lack of devices that may be illustrated herein are not intended to limit the embodiments of the present invention in any way.

It should be noted that only a limited number of active devices, such as the devices 101, and vias, such as via1 and via2, and the TSVs 135, are shown for the ease of illustration and clarity. However, those of ordinary skill in the art will appreciate that, in practice, the integrated circuitry associated with integrated circuits and stacked dies may include millions or even tens of millions or more active and passive devices and, further, that interconnect features may include tens or even hundreds of conductors or more in the uppermost dielectric layers. Similarly, those of ordinary skill in the art will appreciate that each die will, in practice, include dozens or more of back-side connections, such as bonding pads, contacts, balls, leads, etc.

Figure 4A:
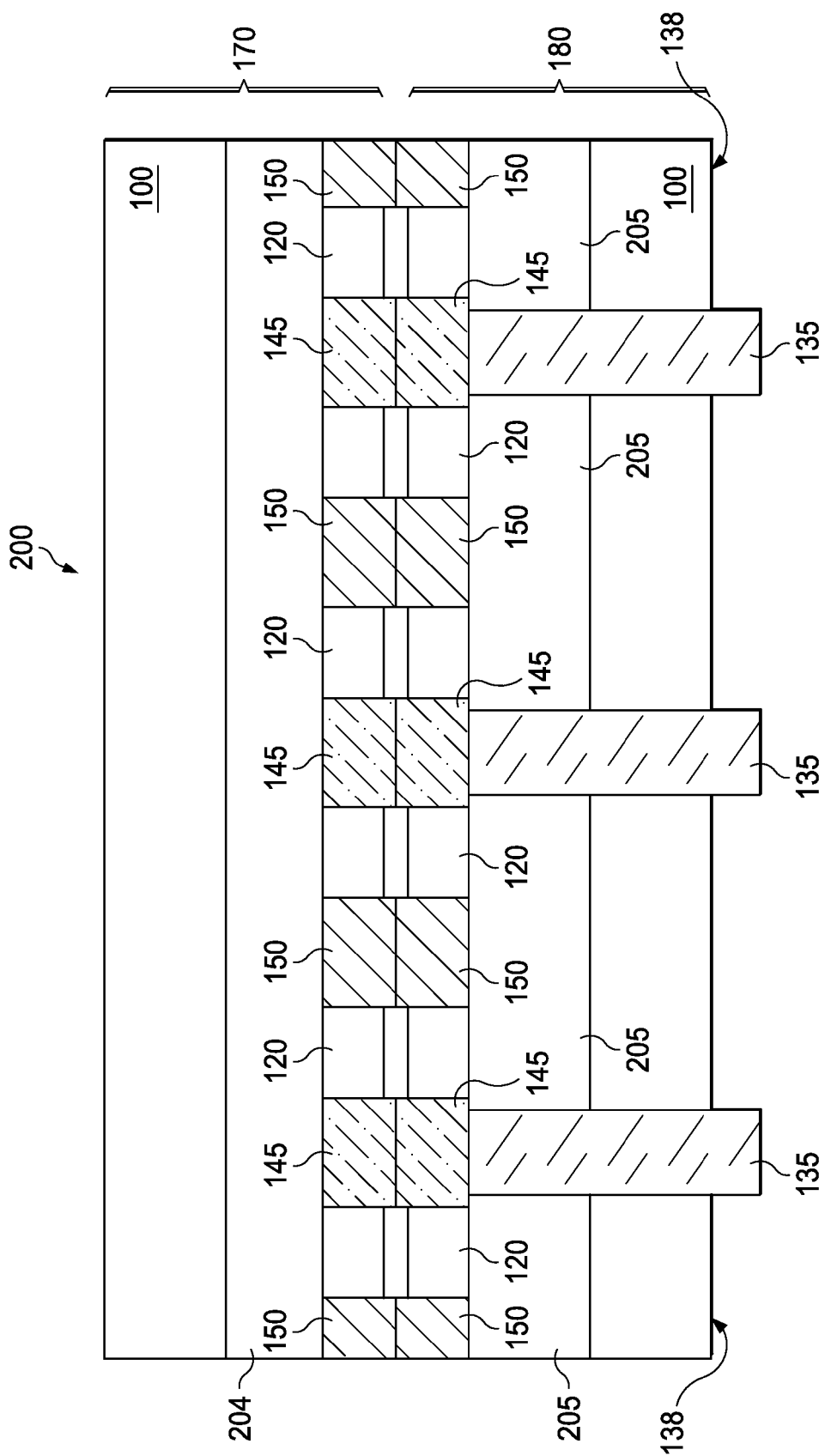
FIGS. 4a-4b illustrate bonding wafers having an on-chip heat spreader to form a 3D stacked chip structure according to an illustrative embodiment.

FIG. 4a illustrates a 3D stacked chip structure in a preferred embodiment of the current invention, where a first wafer 170 with bonding pads 145 on a bonding surface, similar to that described with respect to FIG. 2a, is bonded to a second wafer 180 with bonding pads 145 on a font-side bonding surface to form a stacked chip structure 200. The second wafer 180 has elevated TSVs 135 on a back-side bonding surface, similar to that described with respect to FIG. 3c. The wafer 170 comprises the substrate 100, a dielectric layer 204, the insulating layer 120, the bonding pads 145, and the heat spreader 150. The wafer 180 comprises the substrate 100, a dielectric layer 205, the insulating layer 120, the bonding pads 145, the heat spreader 150 and the TSVs 135. To simplify description, the semiconductor devices 101 formed in the substrate 100 of the wafers 170 and 180 are not shown, and the ILD layer and the IMD layers in the wafers 170 and 180 are labeled as the dielectric layers 204 and 205, respectively. Also, interconnect metal features formed in the dielectric layers 204 and 205 are not shown in order to clarify description. The wafers 170 and 180 are aligned and bonded together at the bonding pads 145. In an embodiment, a bonding medium, such as copper, tungsten, a copper-tin alloy, a gold-tin alloy, an indium-gold alloy, a lead-tin alloy, or the like, is applied to facilitate the bonding between the bonding pads 145 on the wafers 170 and 180. In another embodiment, the stacked chip structure 200 thus formed may be bonded to a third wafer through the elevated contact points of the TSVs 135 on the back-side 138 of the wafer 180. It is observed that, when the stacked chip structure 200 operates in a high power-consumption mode, heat generated in the 3D stacked chip structure is diffused through the heat spreader 150 over a much larger area to the edges of the stacking chip structure, which is subsequently dissipated in the ambient, such as air or other heat conducting medium, thereby cooling the stacking chip structure.

Figure 4B:
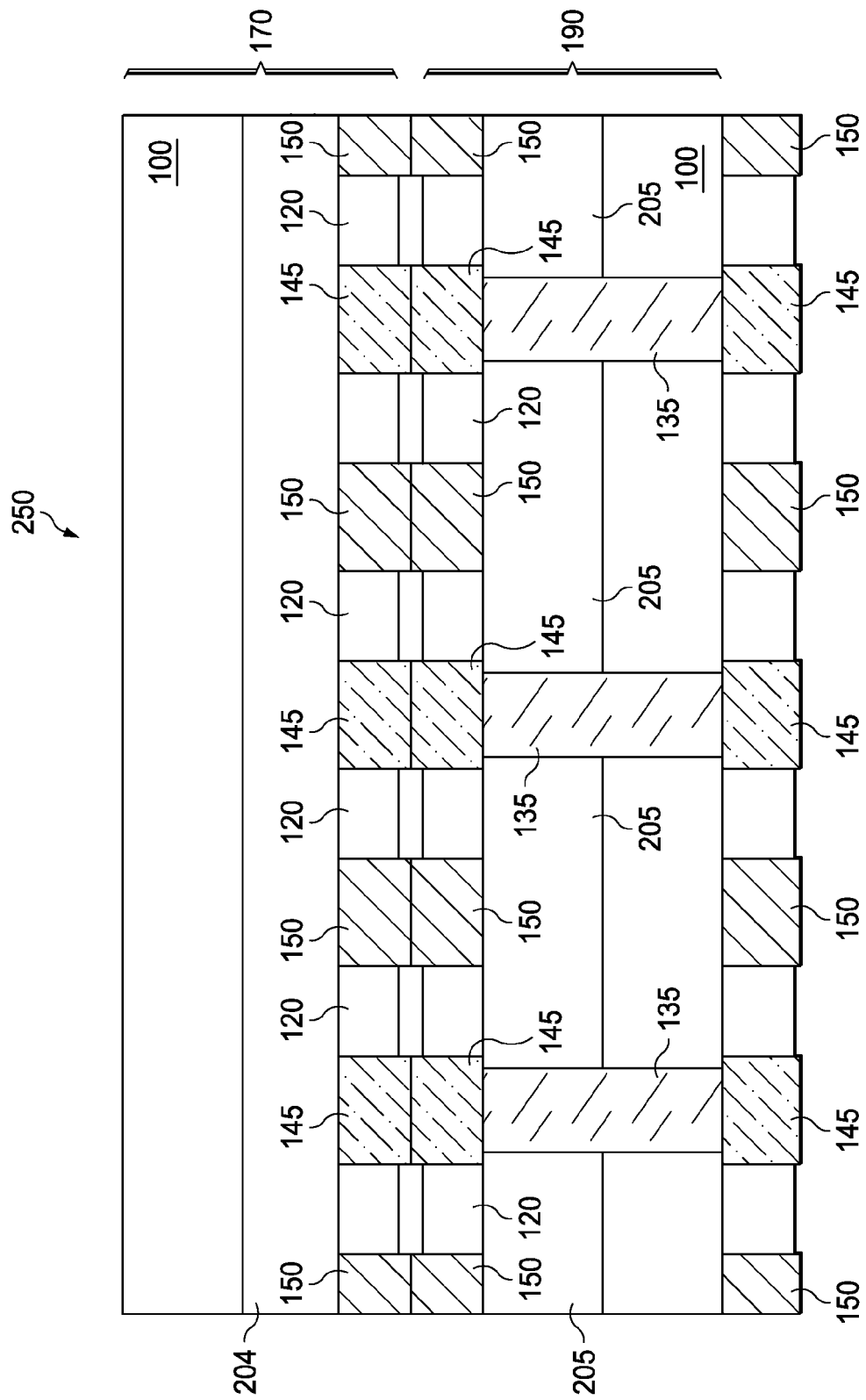

FIG. 4b illustrates a 3D stacked chip structure in another preferred embodiment of the current invention, where the wafer 170 is bonded to the wafer 190 to form the stacked chip structure 250. The wafer 170 is similar to that described with respect to FIG. 4a and FIG. 2a. The wafer 190 is similar to that described with respect to FIG. 3d and comprises the substrate 100, the dielectric layer 206, the insulating layer 120, the bonding pads 145, the heat spreader 150 and the TSVs 135. More noticeably, the bonding pads 145 and the heat spreader 150 are formed on both sides of the wafer 190. Similarly, the semiconductor devices 101 and interconnect metal features in the wafers 170 and 190 are not shown in order to clarify description. The wafers 170 and 190 are aligned and bonded together at the bonding pads 145. In an embodiment, a bonding medium, such as copper, tungsten, a copper-tin alloy, a gold-tin alloy, an indium-gold alloy, a lead-tin alloy, or the like, is applied to facilitate the bonding between the bonding pads 145 on the wafers 170 and 190. In another embodiment, the stacked chip structure 250 thus formed may be bonded to a third wafer through the bonding pads 145 on a back-side of the wafer 190. It can be appreciated that the stacked chip structure 250 has increased heat spreader surface area, which may leads to improved heat dissipation when the stacked chip structure 250 is under high power-consumption operation.

It should be noted that, although the wafers 170, 180, and 190 are illustrated to form a stacked chip structure, the specific wafers used herein are not intended to limit the embodiments of the present invention in any way. In practice, the wafers 170, 180, and 190 may be either a wafer or a die, thus the stacked structure may have a die-to-die bonding configuration, a die-to-wafer bonding configuration, or a wafer-to-wafer bonding configuration.

Figure 5:
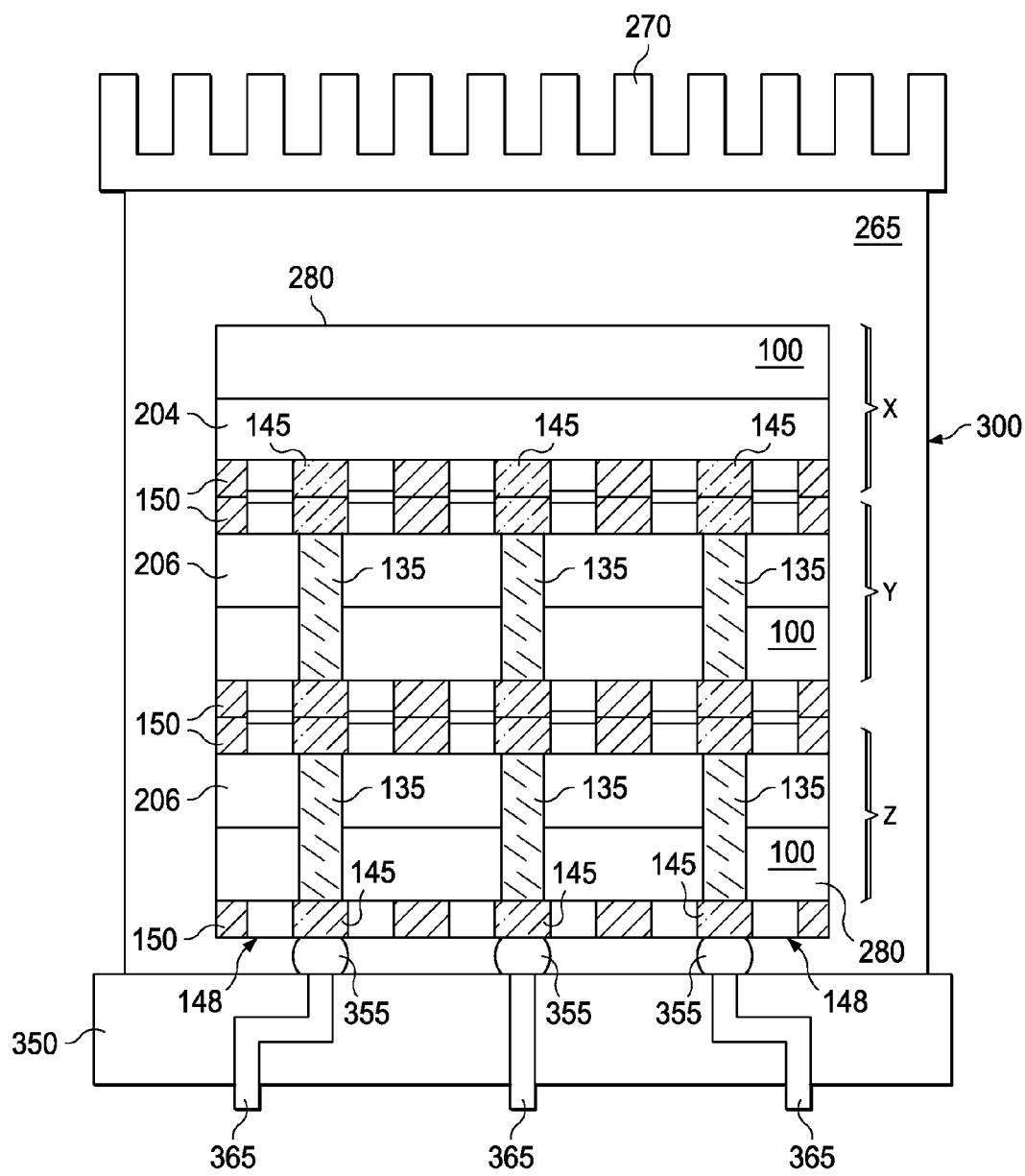
FIG. 5 illustrates an electronic package embodying a 3D stacked chip structure according to an illustrative embodiment.

FIG. 5 illustrates a sectional view of an electronic package 300 embodying a 3D stacked chip structure 280 in one preferred embodiment. The 3D stacked chip structure 280 comprises a first die "X" bonded to a second die "Y," which is in turn bonded to a third die "Z." Die "X" may be, for example, the die 170 described previously with respect to FIG. 2a and FIG. 4a. Dies "Y" and "Z" may each be, for example, a die 190 described previously with respect to FIG. 3d and FIG. 4b. Dies "Y" and "Z" each comprise the bond pads 145 and the heat spreader 150 pre-formed on both a front-side and a back-side. The TSVs 135 pre-formed in the dies "Y" and "Z" are used to electrically couple the various semiconductor devices and components in the dies "X," "Y," and "Z." The bond pads 145 on the back-side of the die "Z" is attached to the package substrate 350 through the solder balls 355, which in turn makes an electrical connection to a printed circuit board (not shown) through the package leads 365. When the stacked chip structure 280 operates in a high power-consumption mode, heat generated in the 3D stacked chip structure is diffused to the edges of the stacked chip structure through the heat spreaders 150 disposed between the individual dies. In this embodiment, the thermally conductive materials 265, such as thermal grease G-751, X23-7762, X23-7783D, may be filled in the package 300 to conduct heat generated from the stacked chip structure 280 out of the package. The heat spreader 270 made of heat conductive metal, e.g., copper or aluminum, may be attached to the package 300 to further expedite the heat dissipation from the package 300.

FIG. 5 also illustrates that the stacked chip structure 280 is attached to a package substrate 350 to form the IC package 300 in a flip-chip ball grid array (BGA) configuration. After the formation of the stacked chip structure 280, a large number of bonding contacts, such as the bonding pads 145 are disposed on a bonding surface 148, generally arranged in an array form. The bonding surface 148 is attached to the package substrate 350 through the solder bumps (e.g., solder balls) 355, which in turn makes electrical connection to a printed circuit board (not shown) through the package leads 365. It is noted that other IC packaging schemes may be also used to package the stacked chip structure 280 in the preferred embodiments. As another example, the stacked dies may be solder-bonded directly to a printed circuit board. The specific devices or lack of devices that may be illustrated herein are not intended to limit the embodiments of the present invention in any way. Also, stacked chip structures in the preferred embodiments may include dozens or even hundreds or more of bonding contacts, for making electrical connection to an IC package, for example, although only a number of the bonding pads 135 are shown.

It should also be noted that each of the example wafers and dies described and illustrated above are meant to provide alternative implementations of contacts, vias, TSVs, bonding contacts that may be used with various embodiments of the present invention. In additional and/or alternative embodiments of the present invention, any combination of the illustrated options may be used. The illustrated embodiments are not intended to limit the implementation of the various additional and/or alternative embodiments of the present invention.

It should further be noted that the different layers described in the illustrated embodiments may comprise various different materials depending on the desired function or availability that the manufacturer determines. The metals used for the metalized bonding contacts may be any suitable metal or alloy, such as copper, tungsten, aluminum, aluminum-copper, and the like. Moreover, depending on the desired use or function of the different dielectric or insulating layers, any such dielectric material may be used, such as silicon dioxide, silicon nitride, USG, PSG, low-k dielectric material, and the like. The present invention is not limited to use with only a certain limited number of compounds and materials.

It should further be noted that the different layers and recesses in the illustrative embodiments may be deposited or created using any number of a variety of known processes. For example, creation of the various layers of oxides, dielectrics, or other layers may be accomplished through PVD, CVD, PECVD, atomic layer deposition (ALD), or the like.

Moreover, removing material from the wafer may be accomplished through dry or wet etching, chemical mechanical polishing CMP, or the like. The present invention is not limited to any single such method.

These and other problems are generally solved or circumvented, and technical advantages are generally achieved, by preferred embodiments of the present invention which provide an on-chip heat spreader.

In one aspect, the present invention provides for a semiconductor die comprising a semiconductor substrate and at least one transistor formed in the semiconductor substrate. The die further includes an interconnect metal feature in an inter-metal dielectric (IMD) layer on a front-side surface of the semiconductor substrate and being coupled to the at least one transistor, and a dielectric layer on the IMD layer. A bonding pad is formed in the dielectric layer electrically coupled to the at least one transistor through the interconnect metal feature, and a heat spreader is formed in the first dielectric layer, the heat spreader being insulated from the bonding pad and including an elongate structure having at least one major axis extending from a center region of the front-side surface of the semiconductor substrate toward and outer edge of the front-side surface of the semiconductor substrate.

In accordance with another aspect, the present invention provides for a stacked chip structure comprising a first semiconductor die and a second semiconductor die. The first semiconductor die has a first bonding pad on a first dielectric layer on a front-side surface, a through-silicon via (TSV) extending through the first semiconductor die, the TSV being coupled to the first bonding pad, and a first heat spreader on the first dielectric layer, the first heat spreader being insulated from the TSV and the first bonding pads and having at least one major axis extending along the front-side surface. The second semiconductor die is attached to the first semiconductor die, and has a second bonding pad on a second dielectric layer on a front-side surface of the second semiconductor die. The second bonding pad is electrically connected to the first bonding pad.

In accordance with yet another aspect, the present invention provides for an electronic package. The package includes a packaging substrate. The package further includes a first semiconductor die on the packaging substrate. The first semiconductor die has a first bonding pad on a first dielectric layer on a front-side surface of the first semiconductor die, a bonding pad on a second dielectric layer on a back-side surface of the first semiconductor die, a through-silicon via (TSV) coupled to the one first and the second bonding pads, respectively, and a first heat spreader on the first dielectric layer. The first heat spreader is insulated from the first bonding pads and the TSV. The package also includes a second semiconductor die on the first semiconductor die. The second semiconductor die has a bonding pad on a third dielectric layer on a front-side surface of the second semiconductor die, wherein the second semiconductor die is electrically coupled to the first semiconductor die via the third bonding pad and the first bonding pad. The package further includes a package housing filled with a thermal conducting medium, the thermal conducting medium contacting the first heat spreader.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
   a semiconductor substrate having at least one active device in the semiconductor substrate;
   a conductive interconnect feature in a first dielectric layer on a first surface of the semiconductor substrate, the conductive interconnect feature being coupled to the at least one active device;
   a second dielectric layer over the first dielectric layer;
   a third dielectric layer over the second dielectric layer;
   a first bonding pad in the third dielectric layer, the first bonding pad being electrically coupled to the conductive interconnect feature; and
   a first heat dissipating structure on the second dielectric layer, the first heat dissipating structure being electrically isolated from the first bonding pad and comprising a first major axis extending toward to an outer edge of the first surface, wherein the first heat dissipating structure has a bottom surface coplanar with a bottom surface of the first bonding pad.

2. The device of claim 1, wherein the first heat dissipating structure comprises a material selected from the group consisting essentially of aluminum (Al), copper (Cu), tungsten (W), cobalt (Co), gold (Au), silver (Ag), a copper-tin alloy, a gold-tin alloy, an indium-gold alloy, a lead-tin alloy, and combinations thereof.

3. The device of claim 1 further comprising:
   a first through substrate via (TSV) extending through the semiconductor substrate;
   a fourth dielectric layer on a second surface of the semiconductor substrate, the second surface being opposite the first surface;
   a second bonding pad on the fourth dielectric layer; and
   a second heat dissipating structure on the fourth dielectric layer, the second heat dissipating structure being electrically isolated from the second bonding pad and the first TSV.

4. The device of claim 3 further comprising a third bonding pad in the third dielectric layer, the second and third bonding pads being electrically coupled to the first TSV.

5. The device of claim 3, wherein the first TSV is coupled to the at least one active device.

6. The device of claim 3, wherein the first and second heat dissipating structures extend to an edge of the semiconductor substrate, respectively.

7. The device of claim 3 further comprising:
   a second TSV extending through the semiconductor substrate;
   a fourth bonding pad in the third dielectric layer, the fourth bonding pad being coupled to a first end of the second TSV; and
   a fifth bonding pad on the fourth dielectric layer, the fifth bonding pad being coupled to a second end of the second TSV.

8. The device of claim 1, wherein the first heat dissipating structure further comprises a second major axis extending toward an outer edge of the semiconductor substrate, the second major axis being perpendicular to the first major axis.

9. A semiconductor device comprising:
a first semiconductor die comprising:
a first bonding pad on a first dielectric layer on a front-side surface of the semiconductor die;
a first through-substrate via (TSV) extending through the first semiconductor die, the TSV having a first end surface coplanar with the front-side surface of the first semiconductor die; and
a first heat spreader on the first dielectric layer, the first heat spreader being insulated from the first TSV and the first bonding pad and having at least one major axis extending along the front-side surface, the first heat spreader having a bottom surface coplanar with the first end surface of the first TSV.

10. The semiconductor device of claim 9, wherein the first semiconductor die comprises one or more active devices, the first TSV being electrically coupled to at least one of the one or more active devices.

11. The semiconductor device of claim 10, wherein the TSV is electrically coupled to the first bonding pad.

12. The semiconductor device of claim 10 further comprising:
a second semiconductor die attached to the first semiconductor die, the second semiconductor die comprising:
a second bonding pad on a second dielectric layer on a front-side surface of the second semiconductor die, wherein the second bonding pad is electrically connected to the first bonding pad; and
a second heat spreader on the second dielectric layer, the second heat spreader being insulated from the second bonding pad and the first bonding pad, and the second heat spreader physically contacting the first heat spreader.

13. The semiconductor device of claim 12, wherein each of the first and second heat spreaders extend to an edge of the semiconductor device.

14. The semiconductor device of claim 12, wherein the second semiconductor die comprises a second TSV extending through the second semiconductor die, the second bonding die being coupled to the second TSV and the first bonding pad being coupled to the first TSV.

15. The semiconductor device of claim 9, wherein the first semiconductor die comprises a third bonding pad on a third dielectric layer on a back-side surface, the third bonding pad being coupled to the first TSV.

16. The semiconductor device of claim 15 further comprising a third heat spreader on the third dielectric layer, the third heat spreader being insulated from the third bonding pad and the first TSV.

17. A method of forming a semiconductor device, the method comprising:
forming a first semiconductor die comprising:
forming a first through substrate via (TSV) through the first semiconductor die, the first TSV having a first end surface coplanar with a front-side surface of the first semiconductor die;
forming a first bonding pad on the front-side surface, the first bonding pad being electrically coupled to the first TSV; and
forming a first heat spreader on the front-side surface, the first heat spreader being insulated from the first TSV and the first bonding pad and having at least one major axis extending along the front-side surface, the first heat spreader having a bottom surface coplanar with the first end surface of the first TSV.

18. The method of claim 17, wherein the first semiconductor die comprises one or more active devices, and wherein the first TSV is electrically coupled to at least one of the one or more active devices.

19. The method of claim 17 further comprising:
forming a second semiconductor die comprising:
forming a second bonding pad on a front-side surface of the second semiconductor die, wherein the second bonding pad is electrically connected to the first bonding pad; and
forming a second heat spreader on the front-side surface of the second semiconductor die, the second heat spreader being insulated from the second bonding pad; and
attaching the first semiconductor die to the second semiconductor die, the first and second bonding pads being electrically coupled and the first and second heat spreaders being physically coupled.

20. The method of claim 19, wherein the forming the second semiconductor die further comprises:
forming a second TSV extending through the second semiconductor die, the second bonding pad being electrically coupled to the second TSV.

* * * * *